FILTER ASSEMBLY

Filed Oct. 26, 1962

INVENTOR.
JOSEPH N. FARACE, JR.

BY

AGENT

United States Patent Office 3,327,254

Patented June 20, 1967

3,327,254

FILTER ASSEMBLY

Joseph N. Farace, Jr., Maple Shade, N.J., assignor to the United States of America as represented by the Secretary of the Navy Filed Oct. 26, 1962, Ser. No. 233,489
7 Claims. (Cl. 333—72)

The invention described herein may be manufactured and used by or for the Government of the United States of America for governmental purposes without the payment of any royalties thereon or therefor.

This invention relates to filters and more particularly to a filter assembly utilizing ferroelectric, electro-mechanical resonators.

With the advent of ferroelectric ceramic materials use of the electromechanical resonator principle in filtering circuits has become highly feasible. In fact, in many applications, particularly in those applications where size of the filter is critical, the electromechanical resonator filter has provided a technological breakthrough.

The electromechanical resonator which takes the form of a tiny disc composed of ferroelectric material is a basic element in this type of filter. Due to its nature packaging of the ferroelectric, electromechanical resonator in various filter configurations is a problem of prime importance in the field. Soldering these electromechanical resonators in place in the filter results in destruction of their electrical properties, since anything that changes the mass normally detunes the electromechanical resonator rendering it useless. Therefore, some other method or technique for packaging the electromechanical resonators in a filter configuration is necessary.

This invention contemplates a unique filter assembly wherein the electromechanical resonator discs are held between pressure contacts which make electrical connection therewith. The present invention further contemplates mounting the electromechanical resonator discs by means of spring contacts within a casing similar to that of a conventional transistor header making external connections via conductor pins from the transistor header-like casing. Once the electromechanical resonator discs are mounted within the casing, the casing may be sealed to provide a vacuum or gaseous environment as desired.

Therefore, it is an object of the present invention to provide a filter structure incorporating therein ferroelectric, electromechanical resonator discs as the basic filter elements.

Another object of the present invention is to provide a structure for mounting ferroelectric, electromechanical resonators of the disc type which does not adversely affect the filter properties of the resonators.

A further object of the present invention is to provide a technique for packaging electromechanical resonators for constructing a filter which is compact, small, ideally suited for use in miniaturized electronic circuitry and easily adaptable to various circuit designs.

Still another object of the present invention is to provide a band-pass filter using any number of ferroelectric, electromechanical resonator discs housed in a unitary assembly which is adaptable to various filter schemes of any desired frequency characteristics.

Other objects and many of the attendant advantages of the invention will become more apparent and better understood from the following description and accompanying drawings wherein like reference numerals designate like parts wherein.

Figure 1:
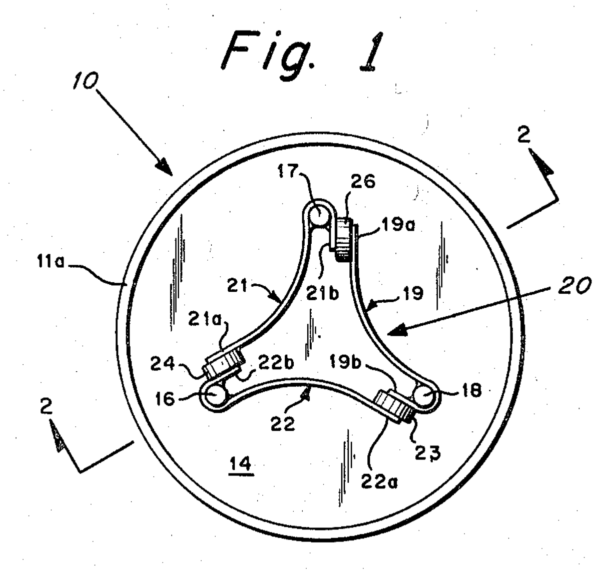
FIG. 1 is a top view with the top portion removed of a preferred embodiment of the present invention.
Figures 2, 4, 5:
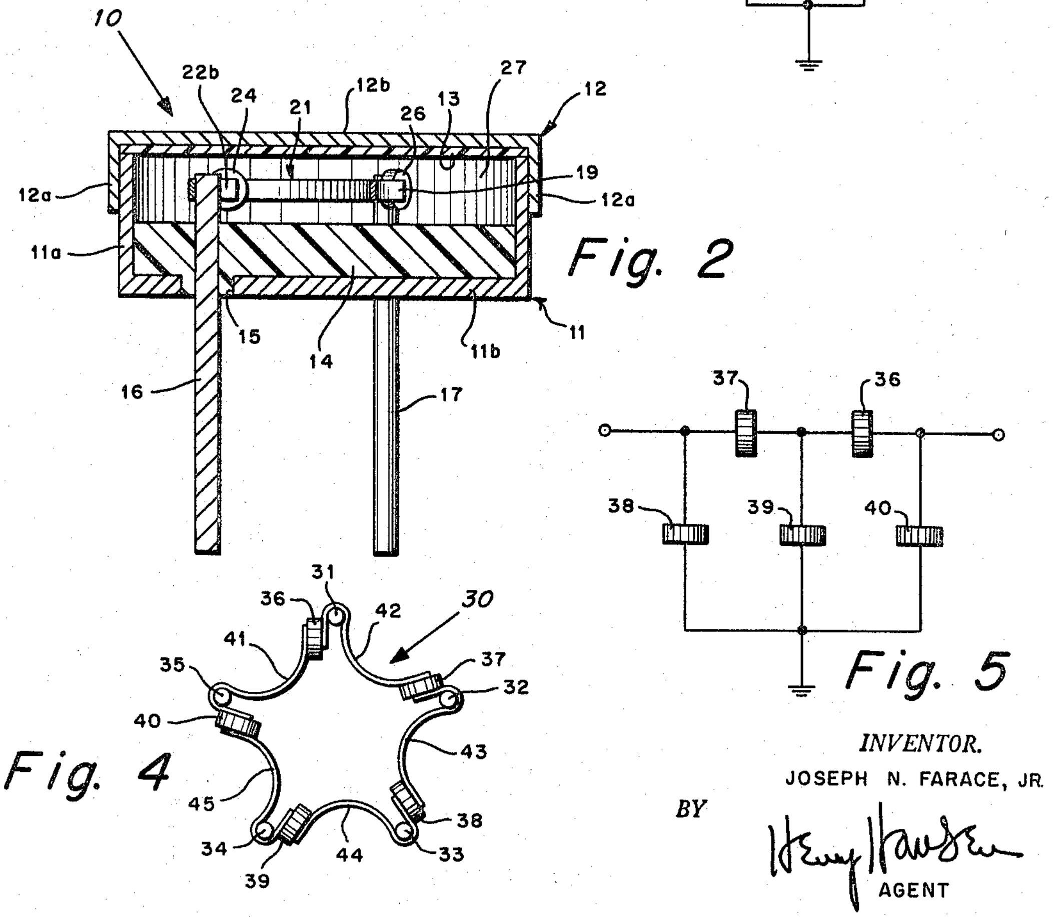
FIG. 2 is an elevation view in section taken through lines 2—2 of FIG. 1.
FIG. 4 is a view of an embodiment of the present invention wherein five electromechanical resonator discs are used.
FIG. 5 illustrates in schematic representation one of the filter circuit arrangements possible with the embodiment shown in FIG. 5.

Referring now more particularly to FIGS. 1 and 2 reference numeral 10 designates the electromechanical resonator-type filter of the present invention. The invention comprises a casing 11 of a circular configuration having sidewall 11*a* and a flat bottom portion 11*b*. The bottom casing 11 is partially filled with a potting material such as epoxy resin in which pins 16, 17 and 18 are imbedded and secured thereby in an upright position as shown. The flat bottom portion 11*b* of casing 11 has three holes therethrough through which extend the pins 16, 17 and 18. FIG. 2 shows one of these holes 15 through which pin 16 extends. The potting material 14 surrounds the pin 16 in the hole 15 thus insulating it from casing 11. Pins 17 and 18 are likewise insulated from casing 11.

Circular shaped casing 12 having sidewall 12*a* and a flat top portion 12*b* is fitted over sidewall 11*a* of bottom casing 11 and forms therewith an airtight seal. Upper casing 12 which may be force fitted to or welded, or otherwise secured to lower casing 11 forms therewith an enclosed space 27 in which the electromechanical resonator discs of the present invention are mounted. The inside area of the top portion 12*b* of casing 12 has bonded thereto or otherwise coated a layer 13 of insulating material.

As best seen in FIG. 2 pins 16 and 17, as well as pin 18, extend into area 27. Welded, soldered, or otherwise secured to form a rigid electrical connection with pins 16, 17 and 18 to form spring assembly 20 are spring elements 22, 21 and 19. This arrangement is best seen in FIG. 1. Each of the spring elements 19, 21 and 22 comprises an end element 19*b*, 21*b* and 22*b* which is looped around pins 18, 17 and 16, respectively and which have a spring-like bias in the outwardly direction. Each of the spring elements 19, 21 and 22 has also an end element 19*a*, 21*a* and 22*a* which has a spring-like bias in the inwardly direction. Disposed between end elements 21*a* and 22*b* is the electromechanical resonator disc 24. Likewise, electromechanical resonator disc 23 is disposed between end elements 22*a* and 19*b* while electromechanical resonator disc 26 is disposed between end elements 19*a* and 21*b*. The spring elements 19, 21 and 22 are made of a conductive metal and since they are electrically connected to their respective ends each of the electromechanical resonators is electrically connected between a pair of the conductor pins. For example, electromechanical resonator disc 24 is electrically connected between pins 17 and 16. Electromechanical resonator discs 23 and 26 are similarly connected.

The electromechanical resonator discs used in this invention are actually dish shaped, that is slightly concave on each side so that contact is actually made along the outer edges thereof by the flat portions of the spring elements. The discs themselves are $\frac{9}{1000}$ of an inch thick and $\frac{60}{1000}$ of an inch in diameter. The electromechanical resonators have been polarized in their axial directions and as used in this invention act as radial mode resonators with the frequency determinative dimension being the diameter. As is obvious from the size of the discs, the whole assembly may be quite small. In fact, transistor headers have been used as the casing for enclosing the discs.

The pressure between spring elements that hold individual electromechanical resonator discs in place is not critical with care only necessary to be taken that pressure is not so great as to break the resonators.

Figure 3:
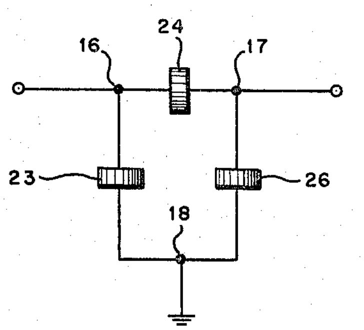
FIG. 3 illustrates in schematic representation one of the filter circuit arrangements that is possible with the assembly of FIGS. 1 and 2.

FIG. 3 illustrates a particular circuit configuration in which the filter assembly of FIG. 1 may be connected, that is, with pins 16 and 17 connected to the terminals of the external circuit while pin 18 is connected to ground. This provides the familiar $\pi$-shaped circuit configuration and, depending on the particular parameters of the electromechanical resonator discs involved, the filter shapes a waveform by letting selected frequencies couple through by resonating and attenuating other frequencies. Thus, band-pass control may be achieved. As is obvious a large number of band passes may be obtained by using electromechanical resonator discs having different frequency properties. As also may be obvious the filter of FIG. 1 may be connected in a T-shaped configuration if desired.

FIG. 4 shows an embodiment of the present invention that differs from the embodiment of FIG. 1 only in that spring assembly 30 of FIG. 4 mounts five electromechanical resonator discs instead of three. FIG. 4 shows conductor pins 31 through 35 which may be mounted within a casing similar to that of FIGS. 1 and 2. Electromechanical resonator discs 36 through 40 are shown disposed between adjacent ones of spring elements 41 through 45.

FIG. 5 illustrates merely one of many various circuit configurations in which the filter assembly of FIG. 4 may be connected to an external circuit. In this case pins 32 and 35 would be connected to the circuit while pins 33 and 34 are connected to ground. By the expedient of coating the outer side of spring element 45 with an insulating material a lead from pin 31 placed between resonator disc 39 and spring element 45, the circuit of FIG. 5 is contrived.

Obviously many modifications and variations of the present invention are possible in the light of the above disclosure without departing from the spirit and the scope of the invention as set forth in the appended claims.

What is claimed is:

1. In a filter assembly:
a plurality of conductor pins,
a like plurality of electrically conductive, adjacent spring means mechanically and electrically connected to respective ones of said conductor pins,
each of said spring means comprising a strip of flexible metal looped at one end about said respective ones of said conductor pins with each of said one ends in substantially parallel relationship and biased in the opposite direction with each of the opposite ends of the next adjacent strip of metal,
an electromechanical resonator disc disposed between each of said one ends and the opposite ends of the next adjacent strip.

2. In a filter assembly:
a plurality of conductor pins,
a like plurality of electrically conductive, adjacent spring means mechanically and electrically connected to respective ones of said conductor pins,
each of said spring means comprising a leaf spring looped about respective ones of said conductor pins,
each of said leaf springs having a first end biased in a first direction and a second end biased in the opposite direction with each of said first ends of said leaf springs in substantially parallel relationship with the said second end of a next adjacent leaf spring,
an electromechanical resonator disc disposed between said first end of each of said leaf springs and said second end of said next adjacent leaf spring.

3. A filter assembly, comprising in combination:
casing means forming a closed space therewithin,
a plurality of conductor pins extending into said casing and terminating within said closed space,
potting means fixedly securing said conductor pins equiangularly about the center of said casing means,
a like plurality of electromechanical resonator discs,
a like plurality of leaf springs each having first and second ends biased in opposite directions with one of said plurality of electromechanical resonator discs disposed between said first end of one of said leaf springs and said second end of an adjacent leaf spring.

4. A filter assembly, comprising in combination:
a cylindrical casing comprising a circular sidewall and a top and bottom portion together forming an air-tight enclosed space,
a plurality of conductor pins extending through said bottom portion and terminating within said enclosed space,
potting means fixedly securing said conductor pins in equiangular relationship about the longitudinal axis of said cylindrical casing,
means electrically insulating said conductor pins from said top and bottom portions of said cylindrical casing,
a like plurality of electromechanical resonator discs,
a like plurality of leaf springs each having first and second ends biased in opposite directions with one of said plurality of electromechanical resonator discs disposed between said first end of one of said leaf springs and said second end of an adjacent leaf spring.

5. A filter assembly, comprising in combination:
casing means forming a closed space therewithin,
a plurality of conductor pins extending into said casing and terminating within said closed space,
potting means fixedly securing said conductors pins equiangularly about the center of said casing means,
a like plurality of adjacent leaf springs formed of thin metal strips electrically and mechanically connected to the ends within said casing means of respective ones of said conductor pins,
each of said leaf springs having one end looped about respective ones of said conductor pins in substantially parallel relationship and biased in an opposite direction to the other end of the next adjacent leaf spring,
an electromechanical resonator disc disposed between said one end of each of said leaf springs and said other end of said next adjacent leaf spring.

6. A filter assembly, comprising in combination:
casing means forming a closed space therewithin,
a plurality of conductor pins extending into said casing and terminating within said closed space,
potting means fixedly securing said conductor pins equiangularly about the center of said casing means,
a like plurality of electrically conductive spring means mechanically and electrically connected to the ends of respective ones of said conductor pins within said closed space,
each of said spring means comprising a strip of flexible metal looped at one end about said respective ones of said conductor pins with each of said one ends in substantially parallel relationship with each of the opposite ends of the next adjacent strip of metal,
an electromechanical resonator disc disposed between each of said one ends and said opposite end of the next adjacent strip of metal.

7. A filter assembly, comprising in combination:
casing means forming a closed space therewithin,
a plurality of conductor pins extending into said casing and terminating within said closed space,
potting means fixedly securing said conductor pins equiangularly about the center of said casing means,
a like plurality of electrically conductive spring means mechanically and electrically connected to respective ones of said conductor pins,
each of said spring means comprising a leaf spring looped about the ends within said closed space of respective ones of said conductor pins,
each of said leaf springs having a first end biased in a first direction and a second end biased in the opposite direction with each of said first ends of said leaf springs in substantially parallel relationship with the said second end of a next adjacent leaf spring, an electromechanical resonator disc disposed between said first end of each of said leaf springs and said second end of said next adjacent leaf spring.

References Cited

UNITED STATES PATENTS

| | | | |
|---|---|---|---|
| 2,155,035 | 4/1939 | Buling | 310—9.6 |
| 2,445,719 | 7/1948 | Sylvester | 310—9.6 |
| 2,493,145 | 1/1950 | Jaffe | 310—9.5 |
| 2,799,789 | 7/1957 | Wolfskill | 310—9.6 |
| 2,830,204 | 4/1958 | Harris | 333—72 |
| 2,877,432 | 3/1959 | Mattiat | 333—72 |
| 2,927,285 | 3/1960 | Curran | 333—72 |

HERMAN KARL SAALBACH, *Primary Examiner.*

C. BARAFF, *Assistant Examiner.*